United States Patent
Kim et al.

(10) Patent No.: US 9,070,777 B2
(45) Date of Patent: Jun. 30, 2015

(54) SEMICONDUCTOR DEVICE AND METHOD FOR FORMING THE SAME

(75) Inventors: Gun Hee Kim, Chungbuk (KR); Jae Woo Park, Seongnam-si (KR); Jin Hyun Park, Gyeongju-si (KR); Byung Du Ahn, Hwaseong-si (KR); Je Hun Lee, Seoul (KR); Yeon Hong Kim, Suncheon-si (KR); Jung Hwa Kim, Gunpo-si (KR); Sei-Yong Park, Suwon-si (KR); Jun Hyun Park, Gangwon-do (KR); Kyoung Won Lee, Ansan-si (KR); Ji Hun Lim, Goyang-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/543,235

(22) Filed: Jul. 6, 2012

(65) Prior Publication Data
US 2013/0181212 A1      Jul. 18, 2013

(30) Foreign Application Priority Data

Jan. 17, 2012   (KR) ........................ 10-2012-0005384

(51) Int. Cl.
  *H01L 29/12*    (2006.01)
  *H01L 21/00*    (2006.01)
  (Continued)

(52) U.S. Cl.
  CPC ...... *H01L 29/7869* (2013.01); *H01L 21/02554* (2013.01)

(58) Field of Classification Search
  None
  See application file for complete search history.

(56) References Cited

U.S. PATENT DOCUMENTS 6,093,882 A * 7/2000 Arimoto ........................ 136/252
6,548,844 B1 * 4/2003 Fukuzumi et al. ............ 257/296
7,994,579 B2    8/2011 Itai
(Continued)

FOREIGN PATENT DOCUMENTS

JP   2010-021333    1/2010
JP   2010-074061    4/2010
(Continued)

OTHER PUBLICATIONS

H. Hosono, "Ionic Amorphous Oxide Semiconductors: Materials Design, Carrier Transport, and Device Application", Journal of Non-Crystalline Solids, 352,851 (2006).
(Continued)

*Primary Examiner* — Bilkis Jahan
*Assistant Examiner* — Kevin Quinto
(74) *Attorney, Agent, or Firm* — F. Chau & Associates, LLC

(57) ABSTRACT

A semiconductor device includes: a substrate, a semiconductor layer including an oxide semiconductor disposed on the substrate, a barrier layer disposed on the semiconductor layer and an insulating layer disposed on the barrier layer. The semiconductor layer includes an oxide semiconductor, and the barrier layer includes a material having a lower standard electrode potential than a semiconductor material of the oxide semiconductor, a lower electron affinity than the semiconductor material of the oxide semiconductor, or a larger band gap than the semiconductor material of the oxide semiconductor. The insulating layer includes at least one of a silicon-based oxide or a silicon-based nitride, and the insulating layer includes a portion which contacts with an upper surface of the barrier layer.

18 Claims, 9 Drawing Sheets

(51) Int. Cl.
*H01L 29/786* (2006.01)
*H01L 21/02* (2006.01)

(56) References Cited

U.S. PATENT DOCUMENTS

| | | | |
|---|---|---|---|
| 8,076,210 | B2 | 12/2011 | Hsiao et al. |
| 2005/0013161 | A1* | 1/2005 | Matsumoto et al. .......... 365/171 |
| 2009/0321731 | A1 | 12/2009 | Jeong et al. |
| 2010/0006834 | A1 | 1/2010 | Kim et al. |
| 2010/0072471 | A1 | 3/2010 | Yamazaki et al. |
| 2010/0133530 | A1 | 6/2010 | Akimoto et al. |
| 2010/0148170 | A1 | 6/2010 | Ueda et al. |
| 2010/0176383 | A1 | 7/2010 | Park et al. |
| 2010/0213459 | A1 | 8/2010 | Shimada et al. |
| 2010/0283049 | A1* | 11/2010 | Sato et al. ....................... 257/43 |
| 2011/0017990 | A1 | 1/2011 | Son et al. |
| 2011/0140096 | A1 | 6/2011 | Kim et al. |
| 2011/0143511 | A1 | 6/2011 | Wang et al. |
| 2011/0147754 | A1 | 6/2011 | Isa et al. |
| 2011/0156026 | A1 | 6/2011 | Yamazaki et al. |
| 2011/0315190 | A1* | 12/2011 | Yoshikawa et al. ............ 136/244 |

FOREIGN PATENT DOCUMENTS

| | | |
|---|---|---|
| JP | 2010-199307 | 9/2010 |
| JP | 2011-138934 | 7/2011 |
| KR | 1020100097002 | 9/2010 |
| KR | 1020130032067 | 1/2013 |
| KR | 1020130049620 | 5/2013 |

OTHER PUBLICATIONS

H.Hosono, "Recent Progress In Transparent Oxide Semiconductors: Materials and Device Application", Thin Solid Films 515 (2007) 6000-6014, 515, 6000 (2007).

Dehuff, et al., "Transparent Thin-Film Transistors With Zinc Indium Oxide Channel Layer", http://dx.doi.org/10.1063/1.1862767, Appl. Phys. 97, 064505 (2005).

Wang, et al, "Room Temperature Deposited Indium Zinc Oxide Thin Film Transistors", http://dx.doi.org/10.1063/1.2746084, Appl. Phys. Lett. 90, 232103 (2007).

Chiang, et al., High Mobility Transparent Thin-Film Transistors with Amorphous Zinc Tin Oxide Channel Layer, http://dx.doi.org/10.1063/1.1843286, Appl. Phys. Lett. 86, 013503 (2005).

Gorrn, et al., "Stability of Transparent Zinc Tin Oxide Transistors Under Bias Stress", http://dx.doi.org/10.1063/1.2458457, Appl. Phys. Lett. 90, 063502 (2007).

Nomura, et al., "Thin-Film Transistor Fabricated in Single-Ctystalline Transparent Oxide Semiconductor", www.sciencemag,org/content/300/5623/1269.full.html, Science, 300, 1269 (2003).

Nomura, et al., "Room-Temperature Fabrication of Transparent Flexible Thin-Film Transistors Using Amorphous Oxide Semiconductors", Nature Publishing Group, vol. 432; pp. 488-492, Nov. 25, 2004.

Kim, et al ,"Electrical Characteristics of Solution-Processed InGaZnO Thin Film Transistors Depending on Ga Concentration", Phys. Status Solidi A 207, No. 7, pp. 1677-1679, Jan. 2010.

Kim, et al, "Amorphous Hafnium—Indium—Zinc Oxide Semiconductor Thin Film Transistors". http://dx.doi.org/10.1063/1.3275801, Appl. Phys. Lett. 95, 252103 (2009).

Jeong, et al., "Investigating Addition Effect of Hafnium in InZnO Thin Film Transistors Using a Solution Process", http://dx.doi.org/10.1063/1.3340943, Appl. Phys. Lett. 96, 093503 (2010).

Kim, et al. "Investigation of the Effects of Mg Incorporation Into InZnO for High-Performance and High-Stability Solution-Processed Thin Film Transistors", http://dx.doi.org/10.1063/1.3413939, Appl. Phys. Lett. 96, 163506 (2010).

Park, et al., "Novel ZrLnZnO Thin-Film Transistor With Excellent Stability", Advanced Materials, vol. 21, pp. 329-333, 2009, Adv. Mater. 21, 329 (2009).

Rim, et al.,"Effect of Zr Addition on ZnSnO Thin-Film Transistors Using a Solution Process" , http//dx.doi.org/10.1063/1 .3524514, Appl. Phys. Lett. 97, 233502 (2010).

Chong, et al.,"Role of Silicon in Silicon—Indium—Zinc—Oxide Thin-Film Transistor", http://dx.doi.org/10.1063/1.3530453, Appl. Phys. Lett. 97, 252112 (2010).

* cited by examiner

SEMICONDUCTOR DEVICE AND METHOD FOR FORMING THE SAME

CROSS-REFERENCE TO RELATED APPLICATION

This application claims priority to Korean Patent Application No. 10-2012-0005384 filed on Jan. 17, 2012, the entire disclosure of which is hereby incorporated by reference herein in its entirety.

(A) TECHNICAL FIELD

The present disclosure relates to a semiconductor device and to a method for forming the same.

(B) DISCUSSION OF THE RELATED ART

Electric elements such as, for example, resistors, capacitors, diodes, and thin film transistors may be applied to various fields, and the thin film transistors (TFT) among them may be used as switching and driving elements in a flat panel display such as a liquid crystal display (LCD), an organic light emitting device (organic light emitting diode display, OLED display), and an electrophoretic display.

In the above-mentioned electric elements, the semiconductor materials may be a factor for determining characteristics thereof. Currently, silicon (Si) is one of the semiconductor materials used in electric elements. The silicon may be divided into, for example, amorphous silicon and polysilicon according to a crystallization type. The amorphous silicon may have a relatively simple manufacturing process but may have a low charge mobility such that there may be a limit in manufacturing a high performance thin film transistor. The polysilicon may have high charge mobility but a process of crystallizing the silicon may be required such that the manufacturing cost may be increased and the process may be relatively complicated.

Accordingly, an oxide semiconductor using a metal oxide having a low cost and high uniformity compared with polycrystalline silicon as well as high charge mobility and a high ON/OFF ratio of current compared with amorphous silicon has been researched.

However, if an insulating layer is deposited on the oxide semiconductor by using plasma, the characteristic of the electric element may be deteriorated by a foreign substance defect generated in an interface between the oxide semiconductor and the insulating layer.

SUMMARY

Exemplary embodiments of the present invention may provide a semiconductor device and a method of forming the same while increasing a characteristic of an electric element using an oxide semiconductor.

A semiconductor device according to an exemplary embodiment of the present invention includes: a substrate, a semiconductor layer including an oxide semiconductor disposed on the substrate, a barrier layer disposed on the semiconductor layer; and an insulating layer disposed on the barrier layer. The semiconductor layer includes an oxide semiconductor, and the barrier layer includes a material including a lower standard electrode potential than a semiconductor material of the oxide semiconductor, a lower electron affinity than the semiconductor material of the oxide semiconductor, or a larger band gap than the semiconductor material of the oxide semiconductor. The insulating layer includes at least one of a silicon-based oxide or a silicon-based nitride, and the insulating layer includes a portion which contacts with an upper surface of the barrier layer.

The oxide semiconductor may include at least one of indium (In), gallium (Ga), zinc (Zn), or tin (Sn).

The barrier layer may include an oxide including at least one selected from a group including aluminum, gallium, yttrium, niobium, silicon, magnesium, hafnium, titanium, lanthanum, lithium, scandium, barium, strontium, or zirconium.

The semiconductor layer may include an indium oxide, a zinc oxide, and a tin oxide, and the barrier layer includes a gallium oxide, an indium oxide, and a zinc oxide.

A gate insulating layer disposed on the substrate, a gate electrode disposed on the gate insulating layer, and a source electrode and a drain electrode disposed between the barrier layer and the insulating layer may be further included, wherein the source electrode and the drain electrode may be separated from each other and the barrier layer and the insulating layer may contact each other in a space between the source electrode and the drain electrode.

A gate insulating layer disposed on the substrate, a gate electrode disposed on the gate insulating layer, a source electrode and a drain electrode disposed between the barrier layer and the insulating layer and separated from each other, and a passivation layer disposed on the source electrode and the drain electrode and contacts with the barrier layer in a space between the source electrode and the drain electrode may be further included.

A gate electrode disposed on the insulating layer, an interlayer insulating layer disposed on the gate electrode and including a contact hole, and a source electrode and a drain electrode disposed on the interlayer insulating layer and connected to the semiconductor layer through the contact hole may be further included.

The insulating layer may include at least one of silicon oxide (SiOx), silicon nitride (SiNx), and silicon oxynitride (SiONx).

A method of forming a semiconductor device according to another exemplary embodiment of the present invention includes: forming a semiconductor layer on a substrate, forming a barrier layer on the semiconductor layer; and forming an insulating layer on the barrier layer by using a deposition method using plasma. The semiconductor layer includes an oxide semiconductor, and the barrier layer includes a material including a lower standard electrode potential than a semiconductor material of the oxide semiconductor, a lower electron affinity than the semiconductor material of the oxide semiconductor, or a larger band gap than the semiconductor material of the oxide semiconductor. The insulating layer includes at least one of a silicon-based oxide or a silicon-based nitride, and the insulating layer includes a portion which contacts with an upper surface of the barrier layer.

The oxide semiconductor may include at least one of indium (In), gallium (Ga), zinc (Zn), or tin (Sn).

The barrier layer may include an oxide including at least one selected from a group including aluminum, gallium, yttrium, niobium, silicon, magnesium, hafnium, titanium, lanthanum, lithium, scandium, barium, strontium, or zirconium.

The semiconductor layer may include an indium oxide, a zinc oxide, and a tin oxide, and the barrier layer may include a gallium oxide, an indium oxide, and a zinc oxide.

The method may further include: forming a gate insulating layer on the substrate, forming a gate electrode on the gate insulating layer and forming a source electrode and a drain electrode between the barrier layer and the insulating layer.

The source electrode and the drain electrode are separated from each other, and the barrier layer and the insulating layer contact each other in a space between the source electrode and the drain electrode.

The method may further include: forming a gate insulating layer on the substrate, forming a gate electrode on the gate insulating layer, forming a source electrode and a drain electrode d between the barrier layer and the insulating layer and separated from each other and forming a passivation layer on the source electrode and the drain electrode and which contacts with the barrier layer in a space between the source electrode and the drain electrode.

The method may further include: forming a gate electrode on the insulating layer, forming an interlayer insulating layer including a contact hole on the gate electrode, and forming a source electrode and a drain electrode connected to the semiconductor layer through the contact hole on the interlayer insulating layer.

The insulating layer may include at least one of silicon oxide (SiOx), silicon nitride (SiNx), or silicon nitroxide (SiONx).

A method of forming a semiconductor device according to an exemplary embodiment of the present invention includes forming a gate electrode on a substrate, forming a gate insulating layer on the gate electrode, forming a semiconductor layer on the gate insulating layer. The semiconductor layer includes an oxide semiconductor and the method further includes forming a barrier layer on the semiconductor layer. The barrier layer includes a material including at least one of a lower standard electrode potential than a semiconductor material of the oxide semiconductor, a lower electron affinity than the semiconductor material of the oxide semiconductor, or a larger band gap than the semiconductor material of the oxide semiconductor.

In addition, the method further includes forming an insulating layer on the barrier layer by using a deposition method using plasma, and the insulating layer includes at least one of a silicon-based oxide or a silicon-based nitride, forming an etch stopper on the barrier layer, forming a source electrode and a drain electrode spaced apart from the source electrode on the barrier layer and forming a passivation layer on the source electrode and the drain electrode. The passivation layer contacts with the etch stopper in a space between the source electrode and the drain electrode.

As above-described, according to an exemplary embodiment of the present invention, the barrier layer having the strong combination force along with the oxygen is formed between the oxide semiconductor and the insulating layer such that the characteristic of the electric element may be increased by preventing the loss of oxygen from the oxide semiconductor which may cause the generation of defects in an interface between the oxide semiconductor and the insulating layer.

BRIEF DESCRIPTION OF THE DRAWINGS

Exemplary embodiments of the present invention can be understood in more detail from the following detailed description taken in conjunction with the accompanying drawings, in which.

DETAILED DESCRIPTION OF EXEMPLARY EMBODIMENTS

Figure 1:
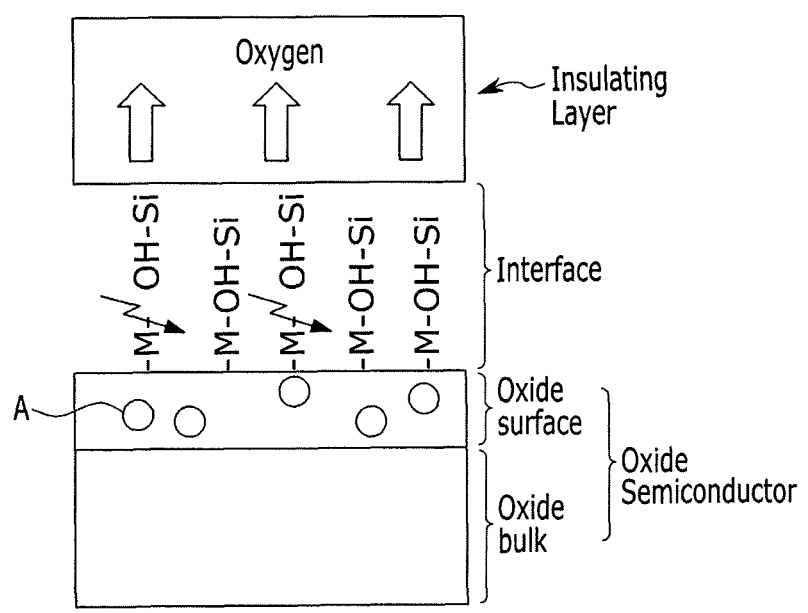
FIG. 1 is a schematic diagram of reactivity of an interface when depositing a silicon-based oxide on an oxide semiconductor.

Exemplary embodiments of the present invention will be described more fully hereinafter with reference to the accompanying drawings, in which exemplary embodiments of the invention are shown. However, exemplary embodiments of the present invention are not limited to the exemplary embodiments described herein, and may be embodied in other forms.

In the drawings, the thicknesses of layers and regions may be exaggerated for clarity. It is to be noted that when a layer is referred to as being "on" another layer or substrate, it can be directly formed on the other layer or substrate or can be formed on the other layer or substrate with one or more layers interposed therebetween. Like constituent elements may be denoted by like reference numerals throughout the specification.

As used herein, the singular forms, "a", "an", and "the" are intended to include plural forms as well, unless the context clearly indicates otherwise.

FIG. 1 is a schematic diagram of reactivity of an interface when depositing a silicon-based oxide on an oxide semiconductor.

Referring to FIG. 1, when depositing a silicon-based oxide or nitride on an oxide semiconductor material, a bulk oxide that occupies most of the region of the oxide semiconductor may not be affected in the deposition process. However, the oxygen of the oxide semiconductor may become disconnected from the surface (the oxide surface) adjacent to the deposited material such that the oxygen may be lost from the silicon. In other words, when the silicon-based oxide insulating layer or the nitride insulating layer is deposited on the oxide semiconductor in a plasma atmosphere such as through, for example, a plasma enhanced chemical vapor deposition (PECVD) or a sputtering method, to obtain a low deposition temperature, increased deposition efficiency, and increased layer quality, silicon-based ions may as result exist in a radical state having high dissolved reactivity. The silicon-based ions generated when depositing the oxide insulating layer or the nitride insulating layer may lose the oxygen of the oxide semiconductor such that an oxygen shortage phenomenon may be generated. Thus, a metal having a low melting point such as, for example, indium and zinc as the component of the oxide semiconductor may be melted by this oxygen shortage phenomenon and may nucleate, thereby causing a protrusion A.

A protrusion of indium or zinc generated in the process of depositing the insulating layer on the oxide semiconductor will be described with reference to FIG. 2.

Figure 2:
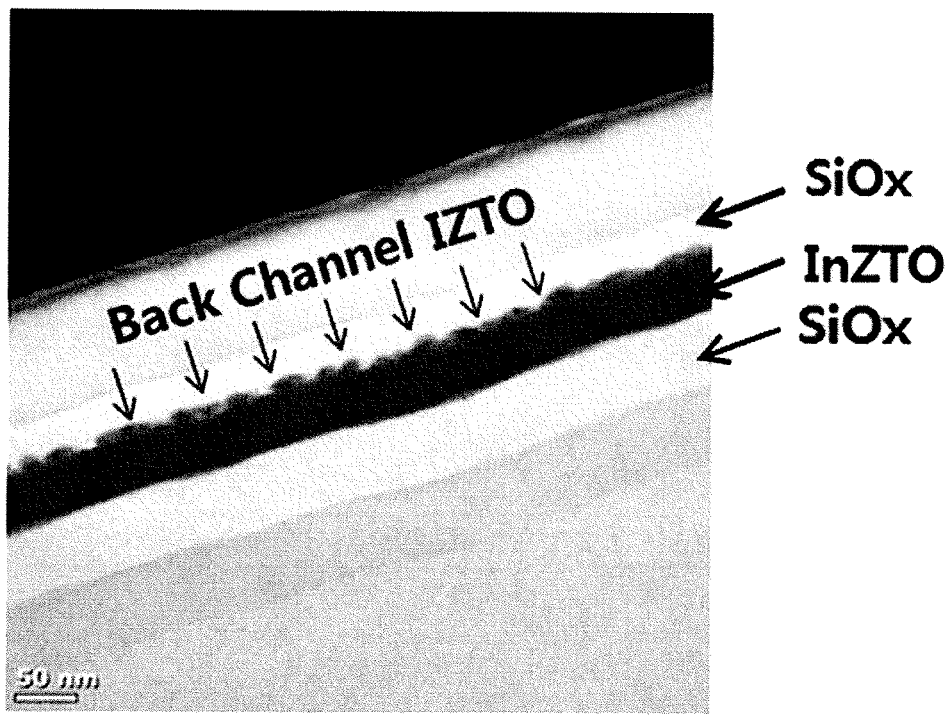
FIG. 2 is an electron microscopic picture of an interface of a thin film structure in which a silicon oxide/an indium-zinc-tin oxide semiconductor/a silicon oxide are sequentially formed.
Figure 3:
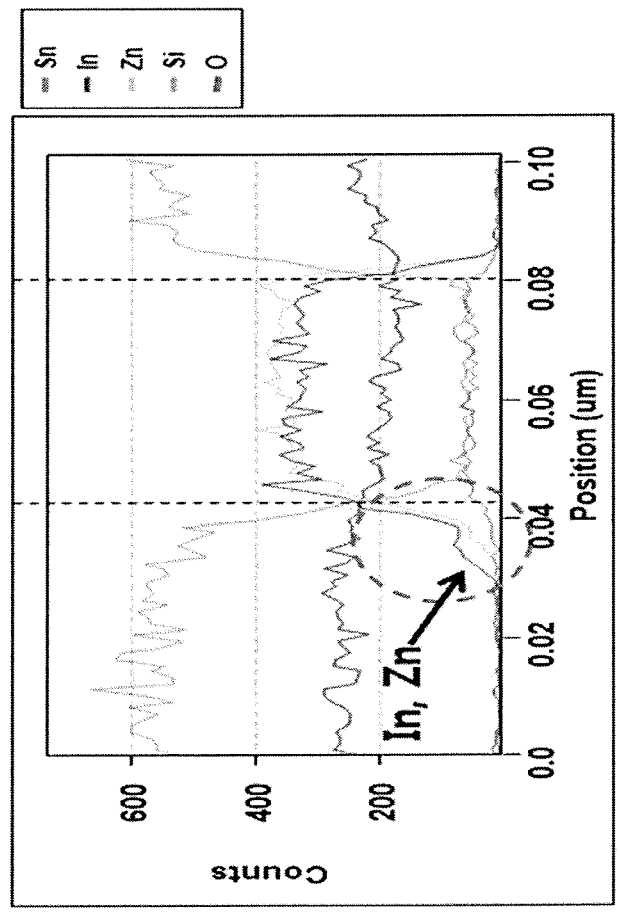
FIG. 3 is a graph of an energy dispersive spectrometer (EDS) component analysis of a thin film structure of FIG. 2.
Figure 3:
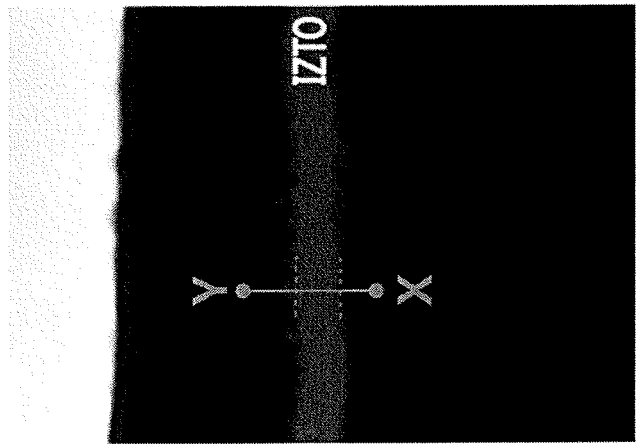

FIG. 2 is an electron microscopic picture of an interface of a thin film structure in which a silicon oxide/an indium-zinc-tin oxide semiconductor/a silicon oxide are sequentially formed. FIG. 3 is a graph of an energy dispersive spectrometer (EDS) component analysis of a thin film structure of FIG. 2.

Referring to FIG. 2, an indium-zinc-tin oxide semiconductor is deposited on a silicon oxide by a sputtering method with a thickness of about 400 Å, and a silicon oxide is deposited by using a gas of $SiH_4$ or $N_2O$ through a PECVD method, and this is photographed through an electron microscope. The indium, zinc, and tin are provided with a ratio of about 21 atomic percent (at %):about 51 at %:about 28 at % to form the oxide semiconductor.

In a layered structure in which the silicon oxide, the indium-zinc-tin oxide semiconductor, and the silicon oxide are sequentially deposited, the interface between the underlying silicon oxide and the indium-zinc-tin oxide semiconductor is smoothly deposited with the reactivity, and the protrusion is generated in the interface between the indium-zinc-tin oxide semiconductor and the overlying silicon oxide. To confirm this, a result of measurement using an EDS as an elementary analysis will be described with reference to FIG. 3.

Referring to FIG. 3, a result of measurement of a generation count of an element according to a position from a start point (X) to a finish point (Y) as in the left photograph is represented as in the right graph. Referring to the right graph of FIG. 3, a distribution of indium and tin in the interface between the indium-zinc-tin oxide semiconductor and the overlying silicon oxide is additionally shown, and the additional distribution of indium and zinc in the interface between the underlying silicon oxide and the indium-zinc-tin oxide semiconductor is relatively small. When depositing the indium-zinc-tin oxide semiconductor after depositing the silicon oxide, the ionized metals of indium, zinc, and tin may not lose the oxygen of the silicon oxide under the sputtering deposition. However, when depositing the silicon oxide on the indium-zinc-tin oxide semiconductor, the ionized silicon ions may have a high combination force along with the oxygen rather than the indium, zinc, and tin in the CVD deposition process such that the oxygen of the indium-zinc-tin oxide semiconductor may be taken, thereby causing a reaction in which the indium protrusion and the zinc protrusion are generated.

The indium protrusion or the zinc protrusion loses the oxygen to the silicon oxide layer such that indium or zinc having the low melting point is agglomerated, and as a result, the material such as the indium-zinc oxide (IZO) may have too low a resistivity to be used as a transparent conductive layer in the actual display element. If the protrusion is formed, the resistance of the channel portion of the thin film transistor may be decreased such that the thin film transistor may be maintained as a normally on state, thereby showing a short characteristic.

Figure 4:
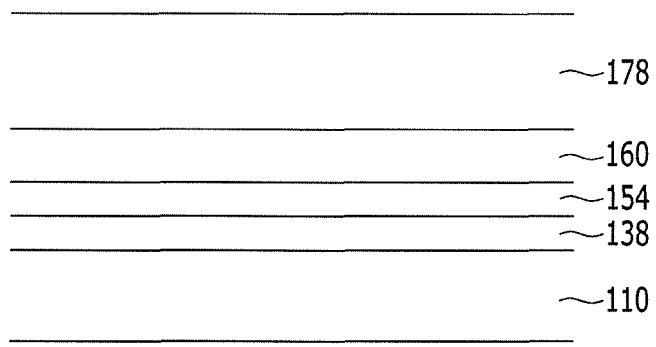
FIG. 4 is a cross-sectional view of a semiconductor device according to an exemplary embodiment of the present invention.

FIG. 4 is a cross-sectional view of a semiconductor device according to an exemplary embodiment of the present invention.

For example, a semiconductor device according to an exemplary embodiment of the present invention is disposed on a substrate 110, and a barrier layer 160 is disposed between a semiconductor layer 154 formed of an oxide semiconductor and an upper insulating layer 178 including at least one of a silicon-based oxide or a silicon-based nitride. The barrier layer 160 includes a material having at least one of, for example, a lower standard electrode potential than the semiconductor material forming the semiconductor layer 154, a lower electron affinity than the semiconductor material forming the semiconductor layer 154, or an oxide having a larger band gap than the semiconductor material forming the semiconductor layer 154. Additionally, a lower insulating layer 138 formed of, for example, at least one of silicon oxide or silicon nitride is disposed between the substrate 110 and the semiconductor layer 154.

The semiconductor layer 154 may be made of, for example, an oxide including at least one of indium (In), gallium (Ga), zinc (Zn), or tin (Sn). For example, in an embodiment, the semiconductor layer 154 may be made of an oxide including an element having a weaker combination force with oxygen than silicon, such as indium-zinc-tin oxide.

Here, the semiconductor layer 154 and the barrier layer 160 may be formed by using, for example, chemical vapor deposition, sputtering, pulse laser deposition, atomic layer deposition, spin coating, inkjet printing, a roll-to-roll method, or nanoimprinting. Also, the upper and lower insulating layers 138, 178 including the silicon-based oxide or the silicon-based nitride may be formed by, for example, chemical vapor deposition, sputtering, or atomic layer deposition that are capable of being deposited in a plasma state.

For example, the semiconductor layer 154 has a thickness of about 10 Å to about 1000 Å, the barrier layer 160 has a thickness of about 50 Å to about 1000 Å, and the upper and lower insulating layers 138, 178 including at least one of the silicon-based oxide or the silicon-based nitride each have a thickness of about 50 Å to about 1000 Å.

The material included in the barrier layer 160 according to the present exemplary embodiment should have at least one of a low standard electrode potential than the semiconductor material of the semiconductor layer 154, a lower electron affinity than the semiconductor material of the semiconductor layer 154, or an oxide having a larger band gap than the semiconductor material of the semiconductor layer 154. The above-mentioned properties for the materials included in the barrier layer 160 will be described in further detail below.

To oxidize a material, an electron should firstly be lost, and energy at this time is referred to as a standard electrode potential (SEP). Also, to combine the metal to an oxygen ion after the electron is lost and to oxidize the metal, a value of the electron negativity should be low. Also, materials having the large band gap under the oxidization may have large activation energy of the conduction band of the electrons of a donor level related to a defect such that the oxygen defect may not be readily generated.

Accordingly, the barrier layer 160 according to an exemplary embodiment of the present invention includes a material having, for example, at least one of a lower standard electrode potential than indium, zinc, and tin forming the oxide semiconductor, an electron affinity lower than indium, zinc, and tin forming the oxide semiconductor, or a band gap of the oxide included in the barrier layer 160 which is larger than zinc oxide (ZnO), indium oxide ($In_2O_3$), and tin oxide ($SnO_2$). The material corresponding to this condition may be summarized as in the following Table 1.

TABLE 1

| Material | Half reaction | SEP E° (V) | Electro- nega- tivity (EN) | Band gap (eV) |
|---|---|---|---|---|
| Zinc | $Zn^{2+} + 2e^- \leftrightarrow Zn(s)$ | −0.76 | 1.65 | ZnO: −3.4 |
| Indium | $In^{3+} + 3e^- \leftrightarrow In(s)$ | −0.34 | 1.78 | In2O3: −3.6 |
| Tin | $Sn^{2+} + 2e^- \rightarrow Sn(s)$ | −0.13 | 1.96 | SnO: −2.5 |
| Aluminum | $Al^{3+} + 3e^- \leftrightarrow Al(s)$ | −1.66 | 1.61 | Al2O3: −8.8 |
| Gallium | $Ga^{3+} + 3e^- \leftrightarrow Ga(s)$ | −0.53 | 1.81 | Ga2O3: 4.7-4.9 |
| Yttrium | $Y^{3+} + 3e^- \leftrightarrow Y(s)$ | −2.37 | 1.22 | Y2O3: 6.1 |
| Niobium | $Nb^{3+} + 3e^- \leftrightarrow Nb(s)$ | −1.10 | 1.60 | Nb2O3: −3.45 |
| Silicon | $Si^{4+} + 4e^- \leftrightarrow Si(s)$ |  | 1.90 | SiO2: −8.8 |
| Magnesium | $Mg^{2+} + 2e^- \leftrightarrow Mg(s)$ | −2.37 | 1.31 | MgO: −7.6 |
| Hafnium | $Hf^{4+} + 4e^- \leftrightarrow Hf(s)$ | −1.70 | 1.30 | HfO2: −5.9 |
| Titanium | $Ti^{4+} + 4e^- \leftrightarrow Ti(s)$ | −1.63 | 1.54 | TiO2: 3.0-3.2 |
| Lanthanum | $La^{3+} + 3e^- \leftrightarrow La(s)$ | −2.38 | 1.10 | La2O3: 4.3-5.3 |
| Lithium | $Li^{3+} + 3e^- \leftrightarrow Li(s)$ | −3.04 | 1.00 | LiO: 2.8-3.0 |
| Scandium | $Sc^{3+} + 3e^- \leftrightarrow Sc(s)$ | −2.36 | 1.30 | Sc2O3: −6.3 |
| Barium | $Ba^{2+} + 2e^- \leftrightarrow Ba(s)$ | −2.91 | 0.89 | BaO: 4.8 |
| Strontium | $Sr^{2+} + 2e^- \leftrightarrow Sr(s)$ | −2.90 | 0.95 | SrO: 6.0 |
| Zirconium | $Zr^{4+} + 4e^- \leftrightarrow Zr(s)$ | −1.45 | 1.30 | ZrO2: 3.4-3.9 |

Referring to Table 1, the cases of indium, zinc, and tin have the characteristics of low standard electrode potential, low electron affinity, and low metal oxide band gap compared with the other materials. According to the present exemplary embodiment, the other materials as well as the above-described indium, zinc, and tin are added to the indium-zinc-tin oxide semiconductor to produce a multi-component oxide semiconductor. A representative material is, for example, an indium-gallium-zinc oxide, a hafnium-indium-zinc oxide, a manganese-indium-zinc oxide, a zirconium-indium-zinc oxide, a zirconium-zinc-tin oxide, and a silicon-indium-zinc oxide. If these oxides are inserted between the semiconductor layer of the indium-zinc-tin oxide semiconductor and the silicon-based insulating layer, when depositing the silicon-based oxide or the silicon-based nitride having the combination force of the oxygen, it may be prevent the oxide semiconductor from losing the oxygen such that the indium protrusion or the zinc protrusion is not generated by the oxygen shortage phenomenon. Accordingly, the non-uniformity and the instability caused in a semiconductor device, such as for example, a thin film transistor by the protrusion phenomenon may be reduced and the photoelectronic reliability of the semiconductor device may be increased.

Figure 5:
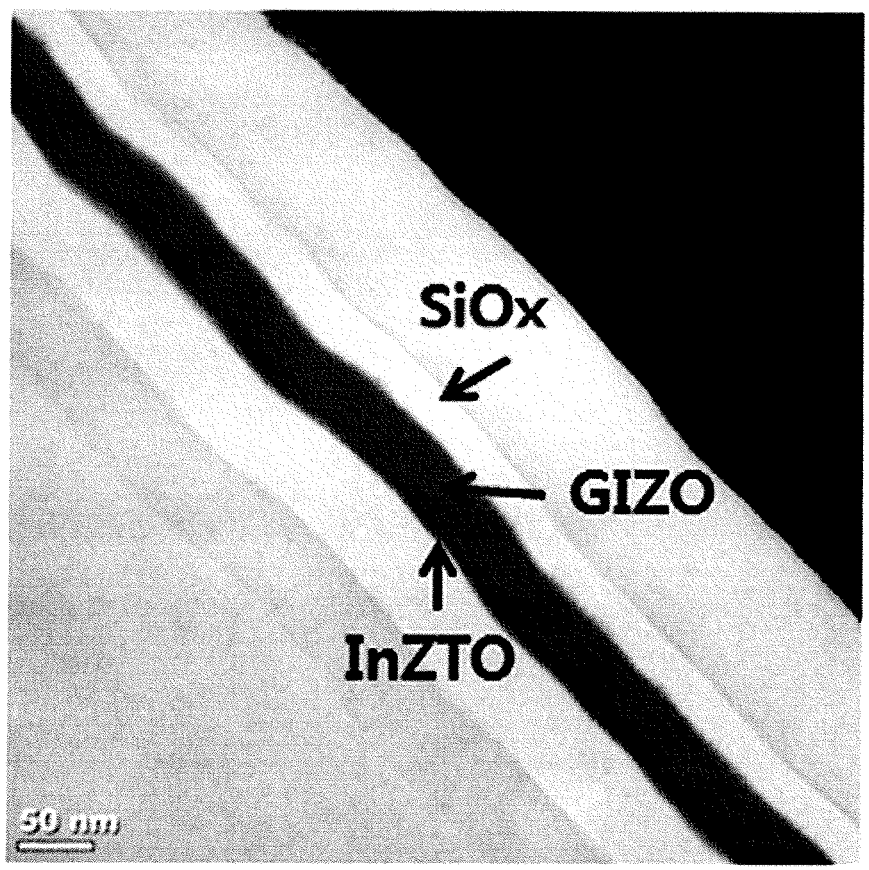
FIG. 5 is an electron microscopic picture of a semiconductor device according to the exemplary embodiment of FIG. 4.
Figure 6:
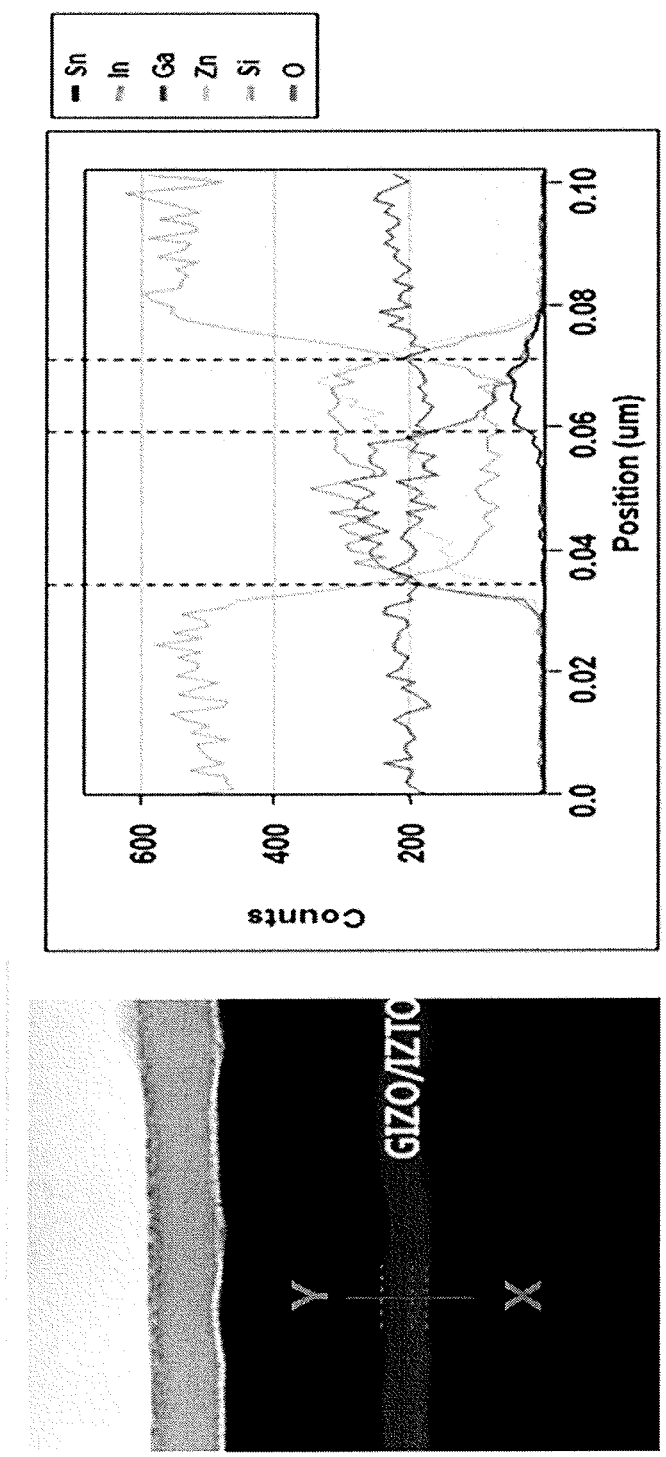
FIG. 6 is a graph of an energy dispersive spectrometer (EDS) component analysis of a thin film structure of FIG. 5.

FIG. 5 is an electron microscopic picture of a semiconductor device according to the exemplary embodiment of FIG. 4. FIG. 6 is a graph of an energy dispersive spectrometer (EDS) component analysis of a thin film structure of FIG. 5.

Referring to FIG. 5, the indium-zinc-tin oxide semiconductor is deposited with a thickness of about 400 Å on the silicon oxide through sputtering, and then the semiconductor layer made of the indium-gallium-zinc oxide including gallium oxide ($Ga_2O_3$) having the large band gap is formed thereon. The silicon oxide (SiOx) is deposited by using $SiH_4$ or $N_2O$ gas through the PECVD on the semiconductor layer formed of the indium-gallium-zinc oxide. At this time, the indium-zinc-tin oxide semiconductor is formed as the oxide semiconductor with a ratio of indium, zinc, and tin of about 21 at %:about 51 at %:about 28 at %, and the percentage ratio of indium, gallium, and zinc in the indium-gallium-zinc oxide semiconductor is about 1:about 1:about 1. Here, the indium protrusion or the zinc protrusion shown in FIG. 2 does not appear. To confirm this, the result of measuring through energy dispersive spectrometer (EDS) component analysis will be described with reference to FIG. 6.

Referring to FIG. 6, a result of measuring a generation count of an element according to a position from a start point (X) to a finish point (Y) like the left photo is represented in the right graph. Referring to the right graph of FIG. 6, in any interface, particularly in the interface of the indium-gallium-zinc oxide semiconductor and the overlying silicon oxide, the distribution of the indium and the tin is not additionally shown. In other words, the indium-gallium-zinc oxide semiconductor that is additionally formed may function as a barrier layer such that the generation of the indium protrusion or the zinc protrusion is prevented.

The above-described thin film structure may be applied to a thin film transistor. In this case, if the thickness of the indium-gallium-zinc oxide semiconductor disposed on the indium-zinc-tin oxide semiconductor is increased, it is experimentally confirmed that a drain current (Ids) measured while changing the gate bias (Vg) from about −30V to about 30V is modulated. This is because the indium protrusion or the zinc protrusion disappears by the reactivity of the zinc-tin oxide semiconductor and the silicon oxide according to the increasing of the thickness of the indium-gallium-zinc oxide semiconductor such that the conductivity is not affected and the semiconductor characteristic is maintained.

Figure 7:
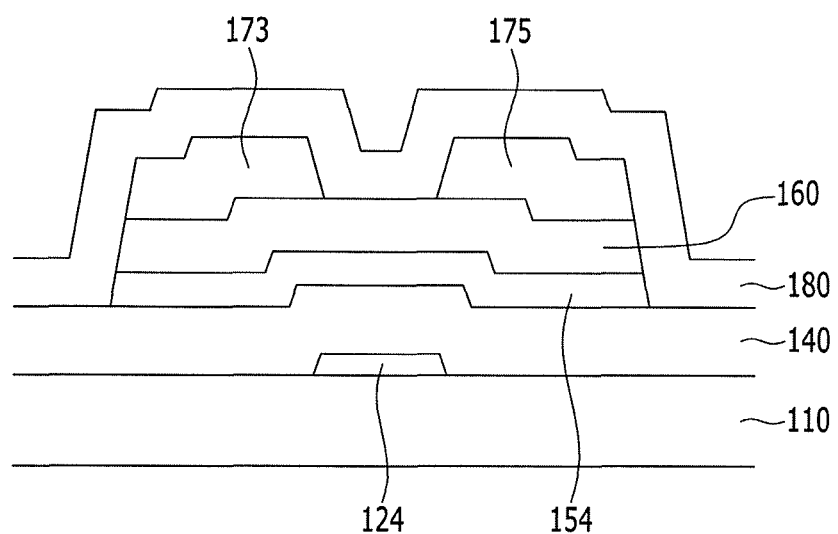
FIG. 7 is a cross-sectional view of a thin film transistor according to an exemplary embodiment of the present invention.

FIG. 7 is a cross-sectional view of a thin film transistor according to an exemplary embodiment of the present invention.

For example, referring to FIG. 7, a gate electrode 124 corresponding to a control electrode in a thin film transistor is disposed on a substrate 110 in the present exemplary embodiment. The gate electrode 124 may be made of a material such as, for example, aluminum (Al), silver (Ag) copper (Cu), molybdenum (Mo), chromium (Cr), tantalum (Ta), and titanium (Ti), nickel (Ni), tungsten (W), gold (Au), palladium (Pd), platinum (Pt), chromium (Cr), neodymium (Nd), zinc (Zn), cobalt (Co), any mixtures thereof and any alloys thereof. In addition, the gate electrode 124 may also be formed of other materials which include, for example, a transparent conductive material such as an indium tin oxide (ITO), an indium zinc oxide (IZO) and an aluminum doped zinc oxide (AZO). Moreover, the gate electrode 124 may also be made of, for example, a multilayer structure including at least two conductive layers having different physical properties. Exemplary embodiments of the present invention are not limited to any of the above-mentioned materials for the gate electrode 124.

A gate insulating layer 140 is disposed on the gate electrode 124. The gate insulating layer 140 may be made of, for example, silicon oxide, silicon nitride, silicon oxynitride (SiON), or a combination thereof. The gate insulating layer 140 may be formed by, for example, sputtering. The gate insulating layer 140 may be made of, for example, a dual layer of silicon oxide, silicon nitride, or silicon oxynitride (SiON). In addition, the gate insulating layer 140 may also be formed of other materials such as, for example, aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), lead titanate ($PbTiO_3$), or a combination thereof. A semiconductor layer 154 is formed on the gate insulating layer 140 and will be described below.

The semiconductor layer 154 and a barrier layer 160 that are made of the oxide semiconductor are formed on the gate insulating layer 140. The semiconductor layer 154 may be made of an oxide of at least one of, for example, indium (In), gallium (Ga), zinc (Zn) or tin (Sn). For example, the semiconductor layer 154 may be made of an oxide including an element having a weak combination force along with the oxygen rather than the silicon, such as indium-zinc-tin oxide.

In the present exemplary embodiment, the barrier layer 160 may include a material having, for example, at least one of a lower standard electrode potential than the semiconductor material of the semiconductor layer 154, a lower electron affinity than the semiconductor material of the semiconductor layer 154, or an the oxide having a larger band gap than the semiconductor material of the semiconductor layer 154. Here, the barrier layer 160 may include, for example, the oxide including at least one selected from a group including aluminum, gallium, yttrium, niobium, silicon, magnesium, hafnium, titanium, lanthanum, lithium, scandium, barium, strontium, or zirconium.

The semiconductor layer 154 and the barrier layer 160 may be formed by, for example, chemical vapor deposition, sputtering, pulse laser deposition, atomic layer deposition, spin coating, inkjet printing, a roll-to-roll method, or nanoimprinting. The insulating layer including the silicon-based oxide or the silicon-based nitride is formed by, for example, chemical vapor deposition, sputtering, or atomic layer deposition to be deposited in the plasma state.

For example, the semiconductor layer 154 has a thickness of about 10 Å to about 1000 Å, the barrier layer 160 has a thickness of about 50 Å to about 1000 Å, and the silicon-based oxide or the silicon-based nitride has a thickness of about 50 Å to about 1000 Å.

A source electrode 173 and a drain electrode 175 separated from each other are disposed on the barrier layer 160.

The source electrode 173 and the drain electrode 175 may be made of a material such as, for example, aluminum (Al), silver (Ag), copper (Cu), molybdenum (Mo), chromium (Cr), tantalum (Ta), and titanium (Ti), nickel (Ni), tungsten (W), gold (Au), palladium (Pd), platinum (Pt), chromium (Cr), neodymium (Nd), zinc (Zn), cobalt (Co), any mixtures thereof and any alloys thereof. For example, a molybdenum alloy in an embodiment may include at least one of Mo—Nb or Mo—Ti. Also, the source electrode 173 and the drain electrode 175 may be made of, for example, a transparent conductive material such as ITO, IZO, and AZO. The source electrode 173 and the drain electrode 175 may also be made of, for example, a multilayer structure including at least two conductive layers (not shown). For example, a multilayer structure of the source electrode 173 and the drain electrode 175 may be made of Mo/Al/Mo, Mo/Al, Mo/Cu, CuMn/Cu, and Ti/Cu. Exemplary embodiments of the present invention are not limited to any of the above-mentioned materials for the source electrode 173 and the drain electrode 175.

A passivation layer 180 is disposed on the source electrode 173 and the drain electrode 175. The passivation layer 180 is formed, for example, filling the separation space between the source electrode 173 and the drain electrode 175 and covering the barrier layer 160 exposed through the separation space.

The passivation layer 180 may be made of, for example, silicon oxide, nitride silicon, silicon oxynitride (SiON), or any combination thereof. Also, the passivation layer 180 may be made of, for example, a dual layer of silicon oxide, silicon nitride, or silicon oxynitride (SiON), and the layer formed of the silicon oxide is disposed on the barrier layer 160. Alternatively, the passivation layer 180 may include an organic insulating material such as, for example, benzocyclobutene (BCB), acryl-based resin or a combination thereof.

Although not shown, an organic layer may be formed on the passivation layer 180. For example, the organic layer may include a parylene, a polyvinyl phenol (PVP), a polyimide, a benzocyclobutene (BCB), or a photoacryl. In an embodiment, the passivation layer 180 may be omitted.

Figure 8:
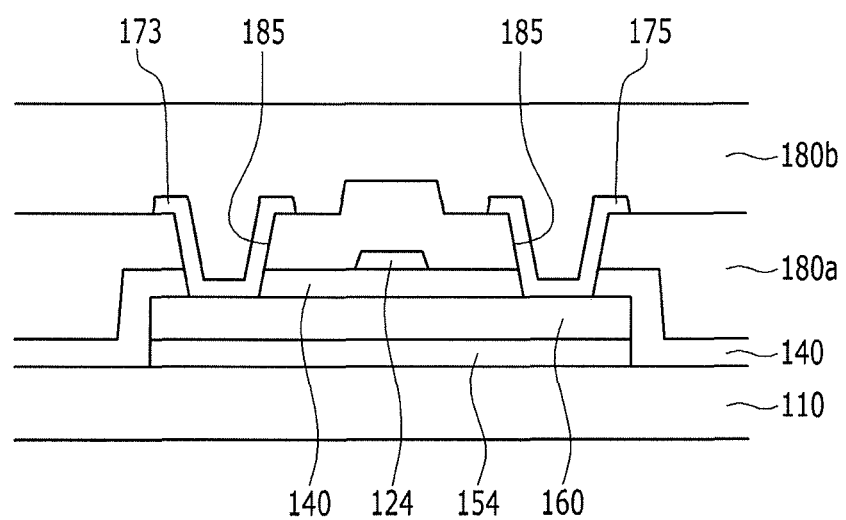
FIG. 8 is a cross-sectional view of a thin film transistor according to an exemplary embodiment of the present invention.

FIG. 8 is a cross-sectional view of a thin film transistor according to an exemplary embodiment of the present invention.

FIG. 8 shows a top gate structure which is different from the bottom gate structure of FIG. 7. For example, a semiconductor layer 154 formed of the oxide semiconductor is disposed on the substrate 110. The semiconductor layer 154 may be made of, for example, an oxide of at least one of indium (In), gallium (Ga), zinc (Zn) or tin (Sn). For example, the semiconductor layer 154 may be formed of, an oxide including an element having a weak combination force along with oxygen rather than silicon such as indium-zinc-tin oxide.

A barrier layer 160 is disposed on the semiconductor layer 154, and the barrier layer 160 may include, for example, a material having at least one of a lower standard electrode potential than the semiconductor material of the semiconductor layer 154, a lower electron affinity than the semiconductor material of the semiconductor layer 154, or an oxide having a larger band gap than the semiconductor material of the semiconductor layer 154. The same materials used to form the semiconductor layer 154 and the barrier 160 of the thin film transistor of FIG. 7 may also be applied to form the semiconductor layer 154 and the barrier layer 160 of the present exemplary embodiment but the present exemplary embodiment is not limited thereto.

A gate insulating layer 140 covering the barrier layer 160 is disposed on the substrate 110. A gate electrode 124 is disposed on the gate insulating layer 140, and an interlayer insulating layer 180a is disposed on the gate electrode 124. A source electrode 173 and a drain electrode 175 are disposed on the interlayer insulating layer 180a, and the source electrode 173 and the drain electrode 175 contact the barrier layer 160 through a contact hole 185 formed in the gate insulating layer 140 and the interlayer insulating layer 180a. Alternatively, in an embodiment, the source electrode 173 and the drain electrode 175 may contact the semiconductor layer 154. The same materials used to form the gate electrode 124, the source electrode 173, the drain electrode 175 and the gate insulating layer 140 of the thin film transistor of FIG. 7 may also be applied to form the gate electrode 124, the source electrode 173, the drain electrode 175 and the gate insulating layer 140 of the present exemplary embodiment but the present exemplary embodiment is not limited thereto.

The barrier layer 160 may be formed in, for example, a narrower area than the semiconductor layer 154.

A passivation layer 180b is disposed on the source electrode 173 and the drain electrode 175. The same materials used to form the passivation layer 180 of the thin film transistor of FIG. 7 may also be applied to form the passivation layer 180b of the present exemplary embodiment but the present exemplary embodiment is not limited thereto. In an embodiment, the passivation layer 180b may be omitted.

Figure 9:
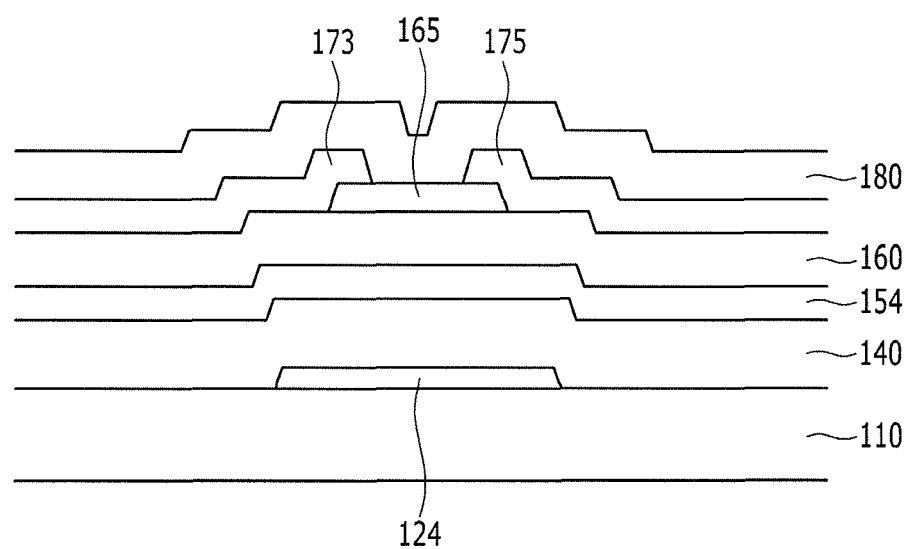
FIG. 9 is a cross-sectional view of a thin film transistor according to an exemplary embodiment of the present invention.

FIG. 9 is a cross-sectional view of a thin film transistor according to an exemplary embodiment of the present invention.

FIG. 9 shows an etch stopper structure. For example, a gate electrode 124 corresponding to a control electrode in a thin film transistor is disposed on a substrate 110, and a gate insulating layer 140 covering the gate electrode 124 is formed on the substrate 110. The gate insulating layer 140 may be made of, for example, silicon oxide, silicon nitride, silicon oxynitride (SiON) or a combination thereof. The gate insulating layer 140 may be formed by, for example, sputtering. In addition, the gate insulating layer 140 may be made of, for example, a dual layer of silicon oxide, silicon nitride, or silicon oxynitride (SiON). A semiconductor layer 154 is formed on the gate insulating layer 140 and will be described below.

The semiconductor layer 154 and a barrier layer 160 that are made of the oxide semiconductor are formed on the gate insulating layer 140. The semiconductor layer 154 may be made of, for example, an oxide including at least one of indium (In), gallium (Ga), zinc (Zn) or tin (Sn). For example, the semiconductor layer 154 may be formed of an oxide including an element having a weak combination force along with oxygen rather than silicon, such as, indium-zinc-tin oxide.

In the present exemplary embodiment, the barrier layer 160 may include, for example, a material having at least one of a lower standard electrode potential than the semiconductor material of the semiconductor layer 154, a lower electron affinity than the semiconductor material of the semiconductor layer 154, or an oxide having a larger band gap than the semiconductor material of the semiconductor layer 154. Here, the barrier layer 160 may include, for example, an oxide including at least one selected from a group including aluminum, gallium, yttrium, niobium, silicon, magnesium, hafnium, titanium, lanthanum, lithium, scandium, barium, strontium, or zirconium.

The semiconductor layer 154 and the barrier layer 160 may be formed by, for example, chemical vapor deposition, sputtering, pulse laser deposition, atomic layer deposition, spin coating, inkjet printing, a roll-to-roll method, or nanoimprinting. The insulating layer including the silicon-based oxide or the silicon-based nitride is formed by, for example, chemical vapor deposition, sputtering, or atomic layer deposition to be deposited in a plasma state.

For example, the semiconductor layer 154 has the thickness of about 10 Å to about 1000 Å, the barrier layer 160 has a thickness of about 50 Å to about 1000 Å, and the silicon-based oxide or the silicon-based nitride has a thickness of about 50 Å to about 1000 Å.

An etch stopper 165 is disposed at a position corresponding to a channel region of the semiconductor layer 154 on the barrier layer 160. A source electrode 173 and a drain electrode 175 are disposed on the barrier layer 160. The source electrode 173 and the drain electrode 175 overlap an edge of the etch stopper 165 and are separated from each other. The etch stopper 165 may be partially exposed at a position where the source electrode 173 and the drain electrode 175 are separated from each other. The etch stopper 165 may be formed with, for example, the silicon-based oxide or the silicon-based nitride.

A passivation layer 180 is disposed on the source electrode 173 and the drain electrode 175. For example, the passivation layer 180 fills the separation space between the source electrode 173 and the drain electrode 175 and covers the etch stopper 165 exposed through the separation space. Although not shown, an organic layer may be formed on the passivation layer 180. For example, the organic layer may include a parylene, a polyvinyl phenol (PVP), a polyimide, a benzocyclobutene (BCB), or a photoacryl. In an embodiment, the passivation layer 180 may be omitted.

The same materials used to form the gate electrode 124, the source electrode 173, and the drain electrode 175, the gate insulating layer 140 and the passivation layer 180 of the thin film transistor of FIG. 7 may also be applied to form the gate electrode 124, the source electrode 173, the drain electrode 175, the gate insulating layer 140 and the passivation layer 180 of the present exemplary embodiment but the present exemplary embodiment is not limited thereto.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A semiconductor device comprising:
   a substrate;
   a semiconductor layer disposed on the substrate;
   a barrier layer disposed on the semiconductor layer; and
   an insulating layer disposed on the barrier layer,
   wherein the semiconductor layer includes an oxide semiconductor including at least one of indium, tin, and zinc,
   wherein the barrier layer includes a first oxide including at least one of indium, tin and zinc and a second oxide including another material including at least one of a lower standard electrode potential than a semiconductor material of the oxide semiconductor, a lower electron affinity than the semiconductor material of the oxide semiconductor, or a larger band gap than the semiconductor material of the oxide semiconductor,
   wherein the insulating layer includes at least one of a silicon-based oxide or a silicon-based nitride,
   wherein the insulating layer includes a portion which contacts with an upper surface of the barrier layer,
   wherein the barrier layer is formed of one layer with the second oxide added in the first oxide,
   wherein the barrier layer contacts the semiconductor layer,
   wherein the second oxide of the barrier layer includes at least one selected from a group including, gallium, yttrium, niobium, magnesium, hafnium, titanium, lanthanum, lithium, scandium, barium, strontium, or zirconium, and
   wherein the second oxide has a higher combination force with oxygen than the oxide semiconductor of the semiconductor layer.

2. The semiconductor device of claim 1, wherein the oxide semiconductor includes indium-zinc-tin oxide (IZTO).

3. The semiconductor device of claim 1, wherein the semiconductor layer includes an indium oxide, a zinc oxide, and a tin oxide, and wherein the barrier layer includes a gallium oxide, an indium oxide, and a zinc oxide.

4. The semiconductor device of claim 1, further comprising:
   a gate electrode disposed on the substrate;
   a gate insulating layer disposed on the gate electrode; and
   a source electrode and a drain electrode disposed between the barrier layer and the insulating layer,
   wherein the insulating layer is a passivation layer disposed on the source electrode and the drain electrode, and
   wherein the barrier layer and the passivation layer contact each other in a space between the source electrode and the drain electrode.

5. The semiconductor device of claim 1, further comprising:
   a gate electrode disposed on the substrate;
   a gate insulating layer disposed on the gate electrode;
   a source electrode and a drain electrode disposed on the barrier layer and the insulating layer; and
   a passivation layer disposed on the source electrode and the drain electrode,
   wherein the insulating layer is an etch stopper disposed corresponding to the semiconductor layer, and
   wherein the etch stopper contacts with the passivation layer in a space between the source electrode and the drain electrode.

6. The semiconductor device of claim 1, further comprising:
a gate insulating layer disposed on the barrier layer;
a gate electrode disposed on the gate insulating layer;
an interlayer insulating layer disposed on the gate electrode and including a contact hole; and
a source electrode and a drain electrode disposed on the interlayer insulating layer and connected to the barrier layer through the contact hole.

7. The semiconductor device of claim 1, wherein the insulating layer includes at least one of silicon oxide (SiOx), silicon nitride (SiNx), or silicon oxynitride (SiONx).

8. A method of forming a semiconductor device, comprising:
forming a semiconductor layer on a substrate;
forming a barrier layer on the semiconductor layer; and
forming an insulating layer on the barrier layer by using a deposition method using plasma,
wherein the semiconductor layer includes an oxide semiconductor including at least one of indium, tin, and zinc,
wherein the barrier layer includes a first oxide including at least one of indium, tin and zinc and a second oxide including another material including at least one of a lower standard electrode potential than a semiconductor material of the oxide semiconductor, a lower electron affinity than the semiconductor material of the oxide semiconductor, or a larger band gap than the semiconductor material of the oxide semiconductor,
wherein the insulating layer includes at least one of a silicon-based oxide or a silicon-based nitride,
wherein the insulating layer includes a portion which contacts with an upper surface of the barrier layer,
wherein the barrier layer is formed of one layer with the second oxide added in the first oxide,
wherein the barrier layer contacts the semiconductor layer,
wherein the second oxide of the barrier layer includes at least one selected from a group including, gallium, yttrium, niobium, magnesium, hafnium, titanium, lanthanum, lithium, scandium, barium, strontium, or zirconium, and
wherein the second oxide has a higher combination force with oxygen than the oxide semiconductor of the semiconductor layer.

9. The method of claim 8, wherein the oxide semiconductor includes indium-zinc-tin oxide (IZTO).

10. The method of claim 8, wherein the semiconductor layer includes an indium oxide, a zinc oxide, and a tin oxide, and wherein the barrier layer includes a gallium oxide, an indium oxide, and a zinc oxide.

11. The method of claim 8, further comprising:
forming a gate electrode on the substrate;
forming a gate insulating layer on the gate electrode; and
forming a source electrode and a drain electrode between the barrier layer and the insulating layer,
wherein the insulating layer is a passivation layer disposed on the source electrode and the drain electrode, and
wherein the barrier layer and the passivation layer contact each other in a space between the source electrode and the drain electrode.

12. The method of claim 8, further comprising:
forming a gate electrode on the substrate;
forming a gate insulating layer on the gate electrode;
forming a source electrode and a drain electrode on the barrier layer and the insulating layer;
forming a passivation layer disposed on the source electrode and the drain electrode; and
forming an etch stopper in contact with the passivation layer in a space between the source electrode and the drain electrode.

13. The method of claim 8, further comprising:
forming a gate insulating layer on the barrier layer;
forming a gate electrode disposed on the gate insulating layer;
forming an interlayer insulating layer including a contact hole on the gate electrode; and
forming a source electrode and a drain electrode connected to the barrier layer through the contact hole on the interlayer insulating layer.

14. The method of claim 8, wherein the insulating layer includes at least one of silicon oxide (SiOx), silicon nitride (SiNx), or silicon oxynitride (SiONx).

15. A method of forming a semiconductor device, comprising:
forming a gate electrode on a substrate;
forming a gate insulating layer on the gate electrode;
forming a semiconductor layer on the gate insulating layer, wherein the semiconductor layer includes an oxide semiconductor;
forming a barrier layer on the semiconductor layer, wherein the barrier layer includes a material including at least one of a lower standard electrode potential than a semiconductor material of the oxide semiconductor, a lower electron affinity than the semiconductor material of the oxide semiconductor, or a larger band gap than the semiconductor material of the oxide semiconductor;
forming an insulating layer on the barrier layer by using a deposition method using plasma, wherein the insulating layer includes at least one of a silicon-based oxide or a silicon-based nitride;
forming an etch stopper on the barrier layer;
forming a source electrode and a drain electrode spaced apart from the source electrode on the barrier layer; and
forming a passivation layer on the source electrode and the drain electrode and wherein the passivation layer contacts with the etch stopper in a space between the source electrode and the drain electrode.

16. The method of claim 15, wherein the semiconductor layer includes indium-zinc-tin oxide and wherein the barrier layer includes indium-gallium-zinc oxide.

17. The method of claim 15, wherein the oxide semiconductor includes at least one of indium (In), gallium (Ga), zinc (Zn), or tin (Sn).

18. The method of claim 17, wherein the barrier layer includes an oxide including at least one selected from a group including aluminum, gallium, yttrium, niobium, silicon, magnesium, hafnium, titanium, lanthanum, lithium, scandium, barium, strontium, or zirconium.

* * * * *